(12) United States Patent
Chih et al.

(10) Patent No.: US 9,165,095 B2
(45) Date of Patent: Oct. 20, 2015

(54) TARGET POINT GENERATION FOR OPTICAL PROXIMITY CORRECTION

(71) Applicant: Taiwan Semiconductor Manufacturing Company, Ltd., Hsin-Chu (TW)

(72) Inventors: Ming-Hui Chih, Luzhou (TW); Wen-Li Cheng, Taipei (TW); Yu-Po Tang, Taipei (TW); Ping-Chieh Wu, New Taipei (TW); Chia-Ping Chiang, Taipei (TW); Yong-Cheng Lin, Hsinchu (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/081,521

(22) Filed: Nov. 15, 2013

(65) Prior Publication Data

US 2015/0143304 A1 May 21, 2015

(51) Int. Cl.
*G06F 17/50* (2006.01)

(52) U.S. Cl.
CPC .................. *G06F 17/5009* (2013.01)

(58) Field of Classification Search
CPC ............ G03F 1/36; G03F 1/144; G03F 7/705; G03F 17/5009
USPC ........................................................ 716/52–54
See application file for complete search history.

(56) References Cited

U.S. PATENT DOCUMENTS

| | | | | |
|---|---|---|---|---|
| 6,813,757 | B2 * | 11/2004 | Aton et al. | 716/53 |
| 7,707,538 | B2 * | 4/2010 | Wong et al. | 716/53 |
| 8,103,984 | B1 * | 1/2012 | Pierrat | 716/53 |
| 2008/0209386 | A1 * | 8/2008 | Naka | 716/20 |
| 2012/0192125 | A1 * | 7/2012 | Fischer et al. | 716/55 |
| 2014/0101624 | A1 * | 4/2014 | Wu et al. | 716/53 |

* cited by examiner

*Primary Examiner* — Jack Chiang
*Assistant Examiner* — Brandon Bowers
(74) *Attorney, Agent, or Firm* — Haynes and Boone, LLP

(57) ABSTRACT

A method performed by a computer processing system includes receiving a design pattern for an integrated circuit, applying a function to the design pattern to generate a model contour, generating a plurality of Optical Proximity Correction (OPC) target points along the model contour, adjusting the design pattern to create an adjusted pattern, and performing a simulation on the adjusted pattern to create a simulated contour.

20 Claims, 6 Drawing Sheets

FIG. 1A  FIG. 1B

TARGET POINT GENERATION FOR OPTICAL PROXIMITY CORRECTION

BACKGROUND

Integrated circuits may be formed using various photolithographic techniques. Such techniques typically involve exposing a photoresist layer to a light source through a patterned photo-mask. In general, the final pattern formed onto the photoresist layer does not precisely match the designed pattern for which the final pattern was formed. This is caused by various photolithographic process parameters such as the resolution of the light source. It is important to ensure that the final printed pattern is not so far from the designed pattern that functionality of the circuit is adversely affected.

Various procedures are used to ensure that the final printed pattern is within the desired tolerance range of the target pattern. One process that is used is referred to as Optical Proximity Correction (OPC). The OPC process typically involves applying a set of rules to determine target points along edges of the design pattern. The design pattern is then modified so that a contour resulting from a simulation of the printout of the modified design pattern approximates the OPC target points.

Use of target points that were determined based on application a set of rules is a time consuming process. The designer may have to make several modifications to the target points based on experience, simulation, and testing in order to bring the final printout within the design specification. Accordingly, it is desirable to have a method of determining the placement of OPC target points that reduces the amount of time a designer or engineer must spend on fine tuning the design pattern to achieve the desired target pattern.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-1C are diagrams showing a set of patterns to illustrate various patterns associated with optical proximity correction, according to one example of principles described herein.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1C:
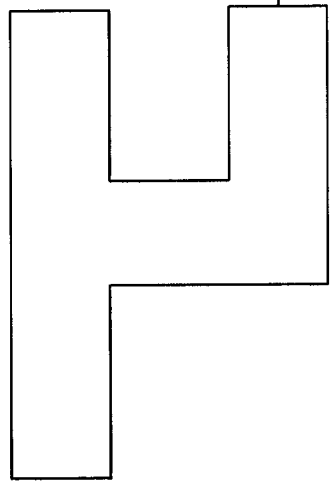
Figure 1C:
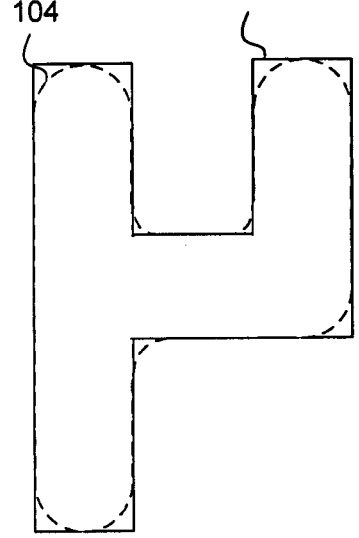
Figure 1C:
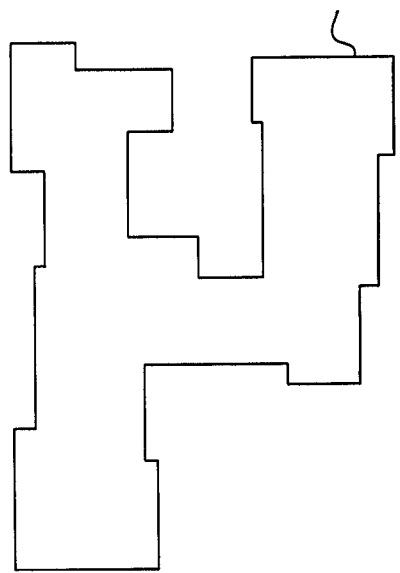

FIGS. 1A-1C are diagrams showing a set of patterns to illustrate various patterns associated with optical proximity correction. According to the present example, FIG. 1A illustrates a design pattern 102. The design pattern 102 represents the layout of a feature as it is originally designed. In real situations, however, it is very difficult to print out a pattern with precise corners as illustrated in the design pattern 102. Consequently, circuit designers typically aim for producing a printout that has corners that are more rounded.

FIG. 1B is a diagram that illustrates a desired printout pattern 104 compared with the design pattern 102. The desired printout pattern 104 represents an ideal printout situation in light of photolithographic constraints. If, however, a mask were to be created using the design pattern 102, the final printout pattern 104 would not likely match the design pattern 102 as well as intended.

For example, without modification, the printed pattern may appear with portions that are thicker or narrower than desired. The thicker portions may cause bridging issues which occur when two features, or two parts of the same feature, are too close. This can cause a short in the final circuit. Another issue is necking. Necking occurs when a particular feature is narrower than intended. This can cause connection issues in the final circuit. Thus, in order to achieve a printout pattern like the desired printout pattern 104 illustrated in FIG. 1B, modifications are typically made to the design pattern 102.

FIG. 1C is a diagram illustrating a modified design pattern 106. According to the present example, the design pattern 102 has been modified to create the modified pattern 106. The modification may include resizing, reshaping, and relocating of various features. These modifications are made based on experience and are done so that a mask formed using the modified pattern will expose a pattern like the desired printed pattern 104 illustrated in FIG. 1B.

Figure 2:
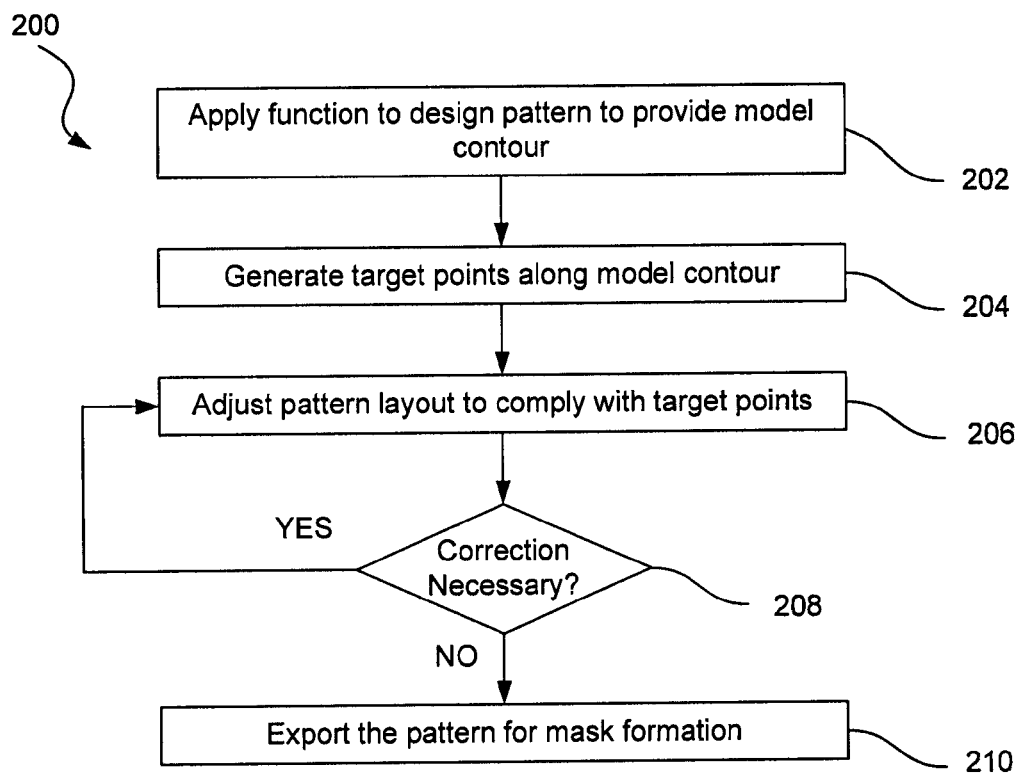
FIG. 2 is a flowchart showing an illustrative method for OPC target point generation along a model contour, according to one example of principles described herein.

FIG. 2 is a flowchart showing an illustrative method for OPC target point generation along a model contour. For purposes of description, the flowchart of FIG. 2 will be discussed in accordance with FIG. 3. FIG. 3 is a diagram showing a set of patterns illustrating target point generation along a model contour.

According to the present example the method 200 includes a step for applying 202 a function on the design pattern to provide a model contour 304. This function is not intended to provide a model contour that would match the actual printout of the design pattern in its current state. Rather, the function is designed to provide a model contour as the pattern is desired to be printed out. For example, it is understood that it is difficult to print out a pattern with perfect right angles. Thus, it is expected that corners will be rounded. Nevertheless, it is desired that the printout be fairly consistent with the design pattern. Thus, the model contour 304 is similar to the design pattern 302, but unlike the design pattern 302, the model contour 304 has rounded corners.

In one example, the function used to create the model contour 304 uses a Gaussian function. The Gaussian function may be used in a variety of ways to create the model contour 304 having curved edges as illustrated in FIG. 3. Additionally, the Gaussian function may be designed to keep the edges of the model contour 304 within a predetermined tolerance range from the design pattern 302. Other functions besides a Gaussian function may be used in accordance with the principles described herein. In some embodiments, a set of image filters may be used to determine the model contour 304.

According to the present example, the method 200 further includes a step for generating 204 target points 306 along the model contour 304. As mentioned above, in conventional OPC processes, the target points are typically applied along the edges of a design pattern 302 based on a set of rules. In a process embodying principles described herein, however, the OPC target points 306 are placed along the model contour 304.

The OPC target points 306 may be placed along the model contour 304 in a variety of manners. In one embodiment, the OPC target points 306 are automatically generated along the model contour 304 at set, specific distances from each other. The specific distances may be determined automatically or may be set manually by a circuit designer. The specific distances may be adjusted based on the needs of the circuit. For example, if a particular circuit should be more precise, than more OPC target points 306 may be generated along the model contour 304 at smaller distances from each other.

According to the present example, the method 200 further includes a step for adjusting 206 the design pattern 302 to comply with the target points 306. This step 206 involves various modifications to the design pattern to create the modified pattern. As mentioned above, modifications may include resizing, reshaping, or relocating various features within the design pattern. Such modifications are made based on experience of what changes should be made in order to bring the actual printed pattern to match the desired printed pattern.

In order to determine if the modifications are sufficient, a simulation is performed on the modified pattern in order to determine a simulated contour 308, 314. The simulated contour 308, 314 is intended to match the actual printout of a pattern printed using the adjusted pattern. The simulated contour 308, 314 is then compared with the location of the OPC target points 306 to determine whether the simulated contour 308, 314 is within a defined tolerance range of the target points.

Figure 3A:
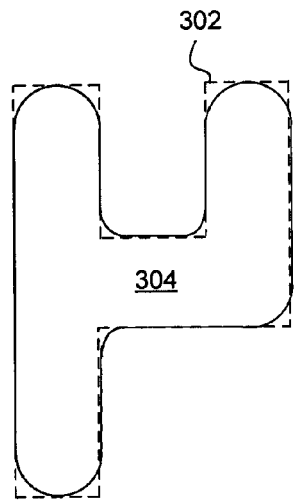
FIGS. 3A-3D are diagrams showing a set of patterns illustrating target point generation along a model contour, according to one example of principles described herein.
Figure 3B:
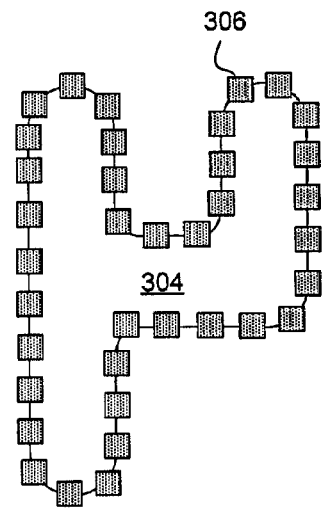
Figure 3C:
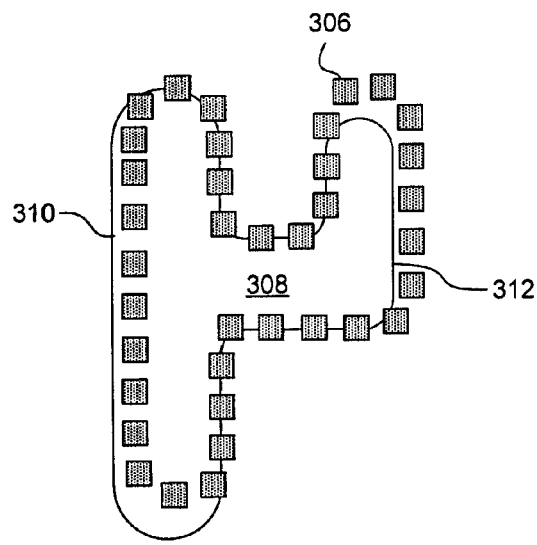

According to the present example, the method includes a step for determining 208 whether further correction of the modified pattern is necessary. For example, FIG. 3C illustrates a first simulated contour 308. A first portion 310 of the simulated contour 308 is outside target points 306. Depending on the defined tolerance range allowed outside of the target points, the placement of this portion 310 outside the OPC target points 306 may be problematic. Thus, further modification of the pattern in order to bring that portion 310 of the simulated contour 308 within the predefined tolerance range of the OPC target points 306 may be necessary.

A second portion 312 of the simulated contour 308 is inside of the OPC target points 306. In some embodiments, if the simulated contour 308 is inside of the target point at any point, then further modification may be necessary to move that portion 312 of the simulated contour 308 outside of the target points 306. In some embodiments, the simulated contour 308 may be allowed to be inside the OPC target points 306 but only within a small tolerance range from the target points 306.

Figure 3D:
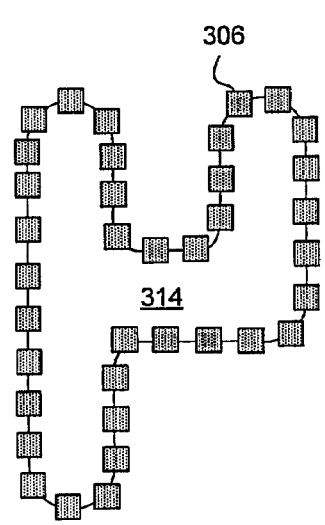

If, at step 208, it is determined that further correction is necessary, then the method 200 returns to step 206 to further adjust the pattern. For example, if the simulated contour 308 appears as illustrated in FIG. 3C, then further modifications are necessary. If, however, the simulated contour 314, as illustrated in FIG. 3D, is within the predefined tolerance range of the target points, then no further adjustments are necessary. Then, at step 210, the modified pattern may be exported to the system that forms the mask.

The mask can then be created and the pattern can be printed onto a substrate. Using the OPC process as described herein, a more efficient OPC target point generation process is realized. Particularly, a circuit designer or process engineer can more efficiently modify the design pattern layout so that the final printed pattern appears as desired.

Figure 4:
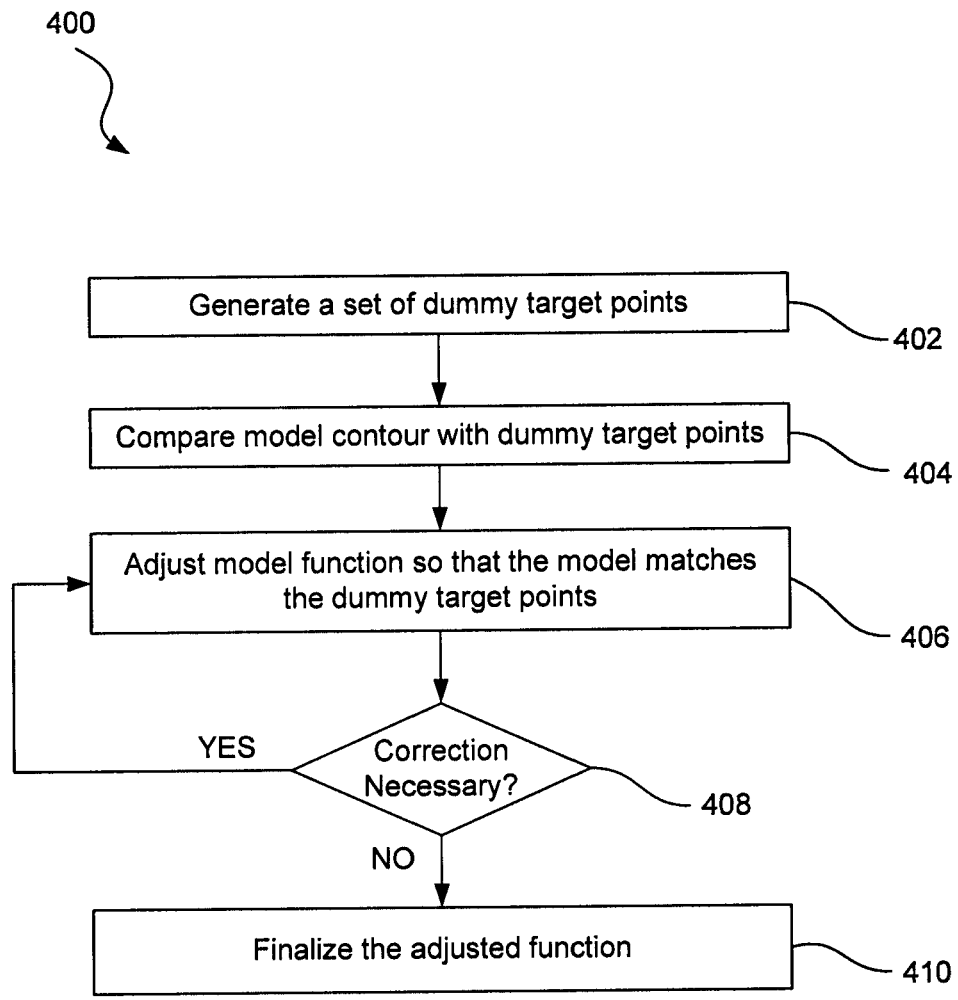
FIG. 4 is a flowchart showing an illustrative method for tuning a model function, according to one example of principles described herein.
Figure 5A:
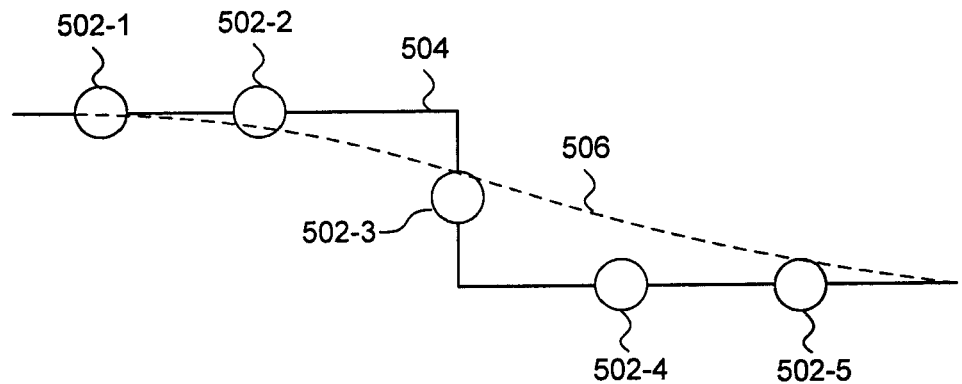
FIGS. 5A and 5B are diagrams showing illustrative model tuning using dummy target points, according to one example of principles described herein.
Figure 5B:
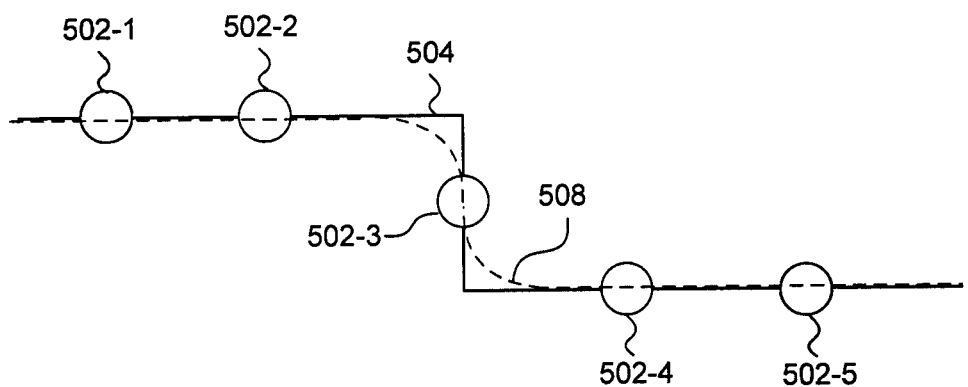

FIG. 4 is a flowchart showing an illustrative method for tuning a model function. For purposes of illustration, FIG. 4 will be discussed along with FIGS. 5A and 5B. FIGS. 5A and 5B are diagrams showing illustrative model tuning using dummy target points. The dummy target points 502 are referred to as such because they are not actually used as target points in the OPC process. Rather, they are used to help fine tune the function used to generate the model contour as described above.

According to the present example, the method 400 includes a step for generating 402 a set of dummy target points 502. FIG. 5A illustrates a set of dummy target points 502 placed along edges of a design pattern 504. In one example, the dummy target points 502 are generated like conventional target points are generated. Specifically, a set of rules is applied to place the dummy target points 502 along edges of a design pattern.

In this example, two dummy target points 502-1, 502-2 are placed along a first edge of the design pattern 504. A single dummy target point 502-3 is placed along a second edge that is perpendicular to the first edge. Two more dummy target points 502-4, 502-5 are placed along a third edge that is parallel to, but not aligned with, the first edge. In this example, the set of rules used to apply the dummy target points 502 does not include a rule that puts target points on corners of the pattern.

The method 400 further includes a step for comparing 404 the model contour with the dummy target points 502. The method 400 further includes a step for adjusting 406 the parameters of the function used to determine the model contour so that the model contour matches the dummy target points. The method 400 further includes a step for determining 408 whether any further adjustment is necessary.

In the example of FIG. 5A, the model contour 506 does not pass through each of the dummy target points 502. While the model contour 506 passes through some of the dummy target points 502, it does not pass through all of the dummy target points 502. Specifically, the model contour 506 only passes through the first dummy target point 502-1. It misses the fourth dummy target point 502-4 altogether. In some examples, the model contour 506 must pass within a defined tolerance range of each dummy target points. If it does not, then further adjustments should be made to the function that generates the model contour.

In the example of FIG. 5B, the model contour 508 passes through each of the dummy target points 502. Thus, no further adjustments should be made to the function because the function now produces a model contour that more closely matches the desired printout of design pattern. The method 400 further includes a step for finalizing 410 the adjusted function for use in creating model contours.

Thus, through use of a system embodying principles described herein, a circuit designer or process engineer may be able to efficiently modify a design pattern so that the final print out is as desired, despite photolithographic process issues. Additionally, the circuit designer or process engineer can fine tune the model for even more precise results.

Figure 6:
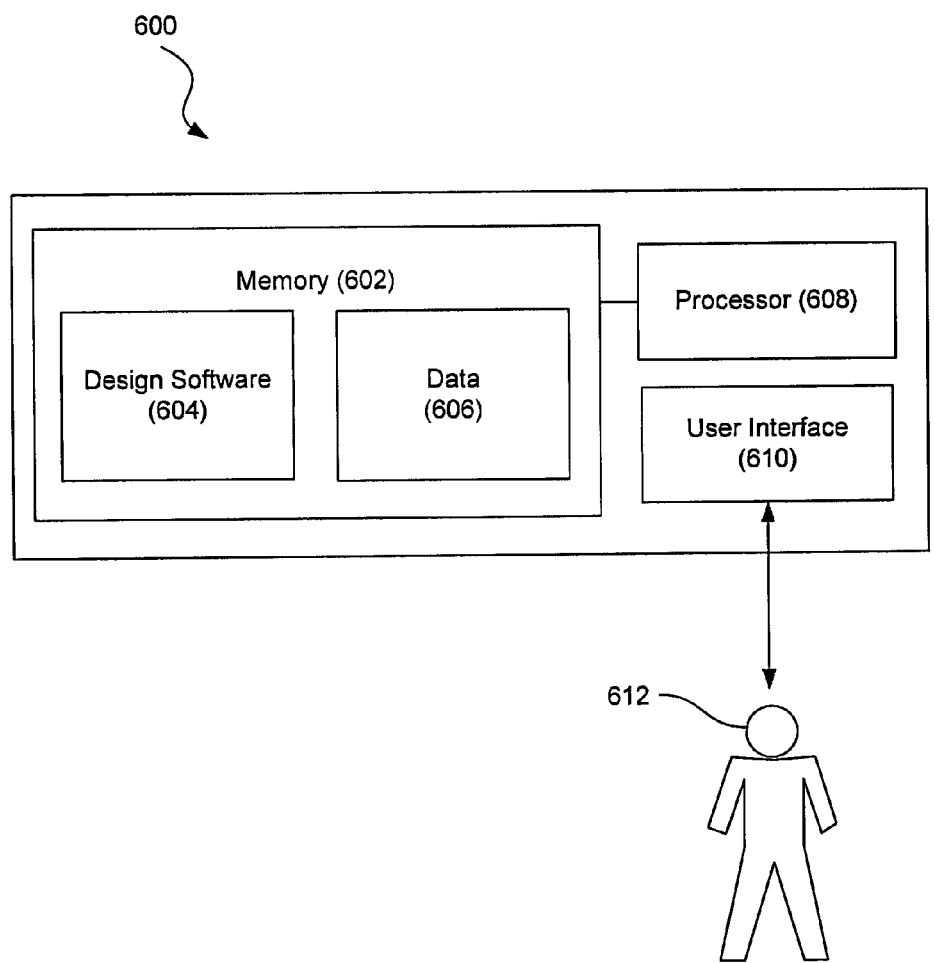
FIG. 6 is a diagram showing an illustrative computer processing system for generating OPC target points along a model contour, according to one example of principles described herein.

FIG. 6 is a diagram showing an illustrative computer processing system for generating OPC target points along a model contour. According to certain illustrative examples, the physical computing system 600 includes a memory 602 having layout software 604 and data 606 stored thereon. The physical computing system 600 also includes a processor 608 and a user interface 610.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 604 and data 606.

The physical computing system 600 also includes a processor 608 for executing the software 604 and using or updating the data 606 stored in memory 602. In addition to storing the layout software 604, the memory 602 may store an operating system. An operating system allows other applications to interact properly with the hardware of the physical computing system. The layout software 604 may include the tools to receive a design pattern and modify the design pattern using OPC target points generated along a model contour. The layout software 604 may also include the tools to fine tune the processes for creating the model contour.

A user interface 610 may provide a means for a user 612 to interact with the system. The user 612 may use various tools such as a keyboard or a mouse to input information into the physical computing system. Additionally, various output devices such as a monitor may be used to provide information to the user 612.

According to certain illustrative examples, a method performed by a computer processing system includes receiving a design pattern for an integrated circuit, applying a function to the design pattern to generate a model contour, generating a plurality of Optical Proximity Correction (OPC) target points along the model contour, adjusting the design pattern to create an adjusted pattern, and performing a simulation on the adjusted pattern to create a simulated contour.

According to certain illustrative examples, a computing system includes a processor and a memory having computer readable instructions stored thereon. The computer readable instructions, when executed by the processor, cause the system to receive a design pattern for an integrated circuit, apply a function of the pattern layout to generate a model contour, the model contour representing a desired contour of a printed pattern, generate a plurality of Optical Proximity Correction (OPC) target points along the model contour, adjust the design pattern to create an adjusted pattern, and perform a simulation on the adjusted pattern to create a simulated contour.

A method performed by a computer processing system includes receiving a design pattern for an integrated circuit, the design pattern representing a desired pattern layout, applying a Gaussian-based function to generate a model contour, the function being designed to simulate a desired printout of the design pattern onto a substrate, generating a plurality of Optical Proximity Correction (OPC) target points along the model contour, adjusting the design pattern to create an adjusted pattern, simulating a printout of the adjusted pattern, and modifying the adjusted pattern if the simulated adjusted printout is not within a defined tolerance range of the OPC target points.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method performed by a computer processing system, the method comprising:
    with the computer processing system, receiving a design pattern for an integrated circuit;
    applying a function to the design pattern to generate a model contour, the model contour representing a desired printout of the design pattern;
    generating a plurality of Optical Proximity Correction (OPC) target points along the model contour;
    adjusting the design pattern to create an adjusted pattern;
    performing a simulation on the adjusted pattern to create a simulated contour;
    applying a set of rules to determine placement for a set of dummy target points;
    adjusting the function so that the model contour passes through the set of dummy target points; and
    exporting the adjusted pattern to a system that forms a mask.

2. The method of claim 1, further comprising, determining whether the simulated contour is within a defined tolerance range of the OPC target points.

3. The method of claim 2, further comprising, further modifying the adjusted pattern if the simulated contour is not within the defined tolerance range of the OPC target points.

4. The method of claim 2, further comprising, using the adjusted pattern to form a mask if the simulated adjusted pattern is within the defined tolerance range of the OPC target points.

5. The method of claim 1, wherein the function comprises a Gaussian function or image filters to determine the model contour of the design pattern.

6. The method of claim 5, further comprising, making adjustments to parameters of the Gaussian function to ensure that the model contour is within a defined tolerance range of the dummy target points.

7. The method of claim 1, further comprising, further adjusting the adjusted pattern in response to determining that a portion of the adjusted pattern is within a defined tolerance range of the OPC target points.

8. The method of claim 1, wherein the dummy target points are generated along edges of the design pattern.

9. A computing system comprising:
a processor; and
a memory having computer readable instructions stored thereon, the computer readable instructions, when executed by the processor, cause the system to:
receive a design pattern for an integrated circuit;
apply a function to the design pattern to generate a model contour, the model contour representing a desired contour of a printed pattern;
generate a plurality of Optical Proximity Correction (OPC) target points along the model contour;
adjust the design pattern to create an adjusted pattern;
perform a simulation on the adjusted pattern to create a simulated contour;
apply a set of rules to determine placement for a set of dummy target points;
adjust the function so that the model contour passes through the set of dummy target points; and
export the adjusted pattern to a system that forms a mask.

10. The system of claim 9, wherein the processor is further to determine whether the simulated contour is within a defined tolerance range of the OPC target points.

11. The system of claim 10, wherein the processor is further to modify the adjusted pattern if the simulated contour is not within the defined tolerance range of the OPC target points.

12. The system of claim 10, wherein the processor is further to use the adjusted pattern to form the mask if the simulated adjusted pattern is within the defined tolerance range of the OPC target points.

13. The system of claim 9, wherein the function comprises a Gaussian function or image filters to determine the model contour of the design pattern.

14. The system of claim 13, wherein the processor is further to make adjustments to parameters of the Gaussian function in response to determining that the model contour is not within a defined tolerance range of the dummy target points.

15. The system of claim 9, wherein the processor is to further adjust the adjusted pattern in response to determining that a portion of the adjusted pattern is within a defined tolerance range of the OPC target points.

16. The system of claim 9, wherein the dummy target points are generated along edges of the design pattern.

17. A method for water patterning in the lithography process of integrated circuit chip manufacturing, the method comprising:
with a computer processing system, receiving a design pattern for an integrated circuit, the design pattern representing a desired pattern layout;
applying a function to generate a model contour, the function being designed to simulate a desired printout of the design pattern onto a substrate;
generating a plurality of Optical Proximity Correction (OPC) target points along the model contour;
adjusting the design pattern to create an adjusted pattern;
simulating a printout of the adjusted pattern;
modifying the adjusted pattern if the simulated adjusted printout is not within a defined tolerance range of the OPC target points;
applying a set of rules to determine placement for a set of dummy target points;
adjusting parameters of the function so that the model contour passes through the set of dummy target points; and
exporting the adjusted pattern to a system that forms a mask.

18. The method of claim 17, wherein providing the adjusted pattern to form the mask is done in response to determining that the simulated adjusted pattern is within the defined tolerance range of the OPC target points.

19. The method of claim 18, further comprising, using the mask to pattern a wafer in an integrated circuit manufacturing process.

20. The method of claim 17, wherein the dummy target points are generated along edges of the design pattern.

* * * * *